United States Patent [19]

Kudoh et al.

[11] Patent Number: 5,391,921
[45] Date of Patent: Feb. 21, 1995

[54] SEMICONDUCTOR DEVICE HAVING MULTI-LEVEL WIRING

[75] Inventors: Osamu Kudoh; Kenji Okada; Hiroshi Shiba; Takuya Katoh, all of Tokyo, Japan

[73] Assignee: NEC Corporation, Tokyo, Japan

[21] Appl. No.: 83,322

[22] Filed: Jun. 29, 1993

Related U.S. Application Data

[63] Continuation of Ser. No. 511,885, Apr. 20, 1990, abandoned.

[30] Foreign Application Priority Data

Apr. 21, 1989 [JP] Japan .................................. 1-102415
Oct. 23, 1989 [JP] Japan .................................. 1-276828

[51] Int. Cl.[6] .................... H01L 23/48; H01L 29/46; H01L 29/54; H01L 29/62
[52] U.S. Cl. .................... 257/758; 257/734; 257/759; 257/760; 257/765; 257/773; 257/774; 257/776
[58] Field of Search ............... 357/68, 71, 74, 65; 257/734, 758, 759, 760, 765, 773, 774, 776

[56] References Cited

U.S. PATENT DOCUMENTS

| | | | |
|---|---|---|---|
| 4,536,951 | 8/1985 | Rhodes et al. | 257/774 |
| 4,914,056 | 4/1990 | Okumura | 357/71 |
| 4,916,521 | 4/1990 | Yoshikawa | 357/68 |
| 4,948,755 | 8/1990 | Mo | 357/71 |
| 4,970,574 | 11/1990 | Tsunenari | 357/68 |
| 4,975,762 | 12/1990 | Stradley et al. | 357/74 |
| 4,984,060 | 1/1991 | Ohmi et al. | 357/68 |
| 5,063,175 | 11/1991 | Broadbent | 357/71 |

OTHER PUBLICATIONS

R. L. M. Dang et al., "Coupling Capacitances for Two-Dimensional Wires", IEEE Electron Device Letters, vol. EDL-2, No. 8, Aug. 1981, pp. 196–197.

Y. Ushiku et al., "A Three-Level Wiring Capacitance Analysis for VLSIs Using a Three-Dimensional Simulator", IEDM 88, pp. 340–343.

Primary Examiner—Andrew J. James
Assistant Examiner—Carl Whitehead, Jr.
Attorney, Agent, or Firm—Sughrue, Mion, Zinn, Macpeak & Seas

[57] ABSTRACT

A semiconductor device that has a feature in the spatial relationship between the wiring in a multi-level wiring and the intermediate insulating films. In the lower part of the second and/or subsequent levels of wiring there exist intermediate insulating films that have a pattern which is the same as the pattern of the wiring. Because of this arrangement, the intermediate insulating film does not exist between the wiring on the same level. The first structure of the multi-level wiring has the intermediate insulating films formed in wall-like shape, with the lower end of the intermediate insulating films reaching an underlying insulating layer formed on the surface of the semiconductor substrate. The second structure of the multi-level wiring is a quasi air gap metallization structure. As a result of realization of such structures, in the semiconductor device according to the present invention, the parasitic capacitance due to the coupling capacitances between the wiring can be reduced compared with a semiconductor device that has a structure in which the spaces between the wiring are filled with the intermediate films.

8 Claims, 8 Drawing Sheets

SEMICONDUCTOR DEVICE HAVING MULTI-LEVEL WIRING

This is a continuation of application Ser. No. 07/511,885, filed Apr. 20, 1990, now abandoned.

BACKGROUND OF THE INVENTION

The present invention relates to a semiconductor device having multi-level wiring and a method of manufacturing multi-level wiring for a semiconductor device.

In recent years, the integration density of semiconductor devices has been raised and the multi-level wiring have been used more frequently, as the scale of the systems realized by the use of semiconductor devices is increased and the fabrication technology for semiconductor devices with fine geometry is advanced. The method which is general for the formation of multi-level wiring in the conventional semiconductor devices is as described below. First, an insulating layer is formed on a semiconductor substrate comprising the required semiconductor elements. A contact hole is formed at a required position in the insulating layer, and then, a first level of wiring is formed. Subsequently, the following steps (1) to (3) are repeated for a necessary number of times: (1) forming an intermediate insulating film, (2) creating a through hole at a required position, and (3) forming wiring for second and subsequent levels.

With the increase in the integration density of semiconductor devices, the space between the wiring also decreases. Because of this, the parasitic capacitance incidental to the wiring increases. A multi-level wiring formed according to the above method has a structure in which an intermediate insulating film is filled between the adjacent wiring without exception. For this reason, the parasitic capacitance incidental to the wiring is further increased.

A discussion about the parasitic capacitance between the wiring is reported, for example, by R. L. M. DANG et al. entitled "Coupling Capacitances for Two-Dimensional Wires" [in IEEE Electron Device Letters, Vol. EDL-2, No. 8, pp. 196 to 197, August 1981. Although this report does not discuss the structure of a multi-level wiring per se, it shows that the parasitic capacitance between the wiring of the same level increases relatively when the line width and spacing of the wiring is decreased. Further, an analysis of the capacitance of a three-level wiring according to a three-dimensional simulation is reported by Y. Ushiku et al. entitled "A THREE-LEVEL WIRING CAPACITANCE ANALYSIS FOR VLSIs USING A THREE-DIMENSIONAL SIMULATOR" in IEDM 88, PP. 340 to 343. This report shows the changes in the coupling capacitance due to the film thickness of the wiring, the pitch of the wiring, the film thickness of the intermediate insulating film and the like, and the change in the coupling capacitance due to the scaling. What is described in these reports is useful for minimizing the parasitic capacitance between the wiring in the conventional structures in which an intermediate insulating film is filled between the adjacent wirings.

Demands for fast operation of the semiconductor devices are recently increasing as the integration density of the semiconductor devices increases. As is clear also from this trend, a reduction in the parasitic capacitance between the wiring is a very important task.

SUMMARY OF THE INVENTION

Accordingly, an object of the present invention is to provide a semiconductor device having a multi-level wiring in which the parasitic capacitance generated by the coupling between the wiring constituting the multi-level wiring is reduced, and to provide a multi-level wiring structure which can realize a reduction in the parasitic capacitance between the wiring.

It is another object of the present invention to provide a method of fabricating a multi-level wiring structure which can reduce the parasitic capacitance between the wirings.

A semiconductor device of the present invention has a multi-level wiring with two or more levels. The wiring of the second and the subsequent levels are formed on the first level of wiring formed on a semiconductor substrate via an insulating layer, with an intermediate insulating film inserted between them. The semiconductor substrate has the required semiconductor elements formed on it, the insulating layer has a contact hole at a required position, and the intermediate insulating films have through holes at required positions. With respect to the wiring of the second and subsequent levels, there does not exist an intermediate insulating film between the wiring on the same level. Further, in the lower part of the wiring of the second and the subsequent levels, except for the areas for the through holes, there exists an intermediate insulating film having the same pattern as that of the wiring of the second and the subsequent levels, making contact with the wiring.

The package for the semiconductor device of the present invention is preferably a package having a cavity structure such as a hermetic seal type ceramic package.

In accordance with a first aspect of the present invention, the intermediate insulating film reaches to the insulating layer formed on the major surface of the semiconductor substrate. Preferably, the intermediate insulating film includes an organic insulator material such as a polyimide film or a polyimide siloxane film. When the intermediate insulating film is made of an inorganic insulator material, it is preferable to have the insulating layer formed on the major surface of the semiconductor substrate is made of an inorganic insulator material different from that of the intermediate insulating film.

In accordance with a second aspect of the present invention, the intermediate insulating films formed between the wiring have a wall-like structure and there exists a cavity between the respective intermediate insulating films. Accordingly, there is formed a cavity between the insulating layer formed on the major surface of the semiconductor substrate and the intermediate insulating film. Preferably, the intermediate insulating film is made of an inorganic insulator material by a plasma chemical vapor deposition, and is a silicon oxide film, a silicon nitride film or a silicon oxynitride film.

A first aspect of the method of manufacturing a semiconductor device according to the present invention includes the steps as shown below. First, an insulating layer is formed on a major surface of a semiconductor substrate which has prescribed semiconductor elements on it. A contact hole is formed at a required position in the insulating layer and then, a first level of wiring is formed. A first intermediate film between the first level of wiring and a second level of wiring is formed. A first group of through holes are formed at required positions in the first intermediate insulating film and on top of this, there is formed a second level of wiring. The respective intermediate insulating films and the wiring of the second and the subsequent levels are formed by the same technique as in the above. After forming the wiring of the topmost layer, the laminated intermediate insulating films are etched using the wiring of the second and the subsequent levels as the etching masks. This etching is preferred to be an anisotropic plasma etching.

A second aspect of the method of manufacturing a semiconductor device according to the present invention includes the steps as shown below. First, an insulating layer is formed on a semiconductor substrate that has prescribed semiconductor elements on it. A contact hole is formed at a required position in the insulating layer. Then, a first level of wiring is formed. Subsequently, a first organic insulator layer is formed on the entire top surface. The first organic insulator layer is etched back until the top surface of the first level of wirings is exposed. A first intermediate insulating film between the first level of wiring and a second level of wiring is formed allover the surface. The first intermediate insulating film is composed of an inorganic insulator material obtained by a plasma vapor deposition. A first group of through holes are formed at required places. A conductive film for the second level of wiring is formed on the entire surface. A first photoresist film pattern for the second level of wiring is formed. The second level of wiring is formed by etching the conductive film for the second level of wiring using the first photoresist film pattern as the mask. Further, the first intermediate insulating film with the same pattern as the second level of wiring, except for the first group of through holes, is formed by etching the first intermediate insulating film using the first photoresist film pattern as the mask. Then, the first photoresist film pattern is peeled off. After forming the organic insulator layers of the respective levels, the respective intermediate insulating films and the wiring of the second and the subsequent levels according to the procedures similar to the above, and after peeling off the pattern of a photoresist film for the wiring of the uppermost level, the organic insulator layers for the respective levels are removed. The component materials of the organic insulator layers for the respective levels and the intermediate insulating films for the respective levels are the same as those of the first organic insulator layer and the first intermediate insulating film. The organic insulator layer is preferable to be a polyimide film or a polyimide siloxane film. The removal of the organic insulator layer is prefered to be carried out by an isotropic oxygen plasma etching.

Since in the semiconductor device of the present invention there does not exist an intermediate insulating film between the wiring of the same level, it is possible to reduce the parasitic capacitance of the wiring the multi-level wiring.

BRIEF DESCRIPTION OF THE DRAWINGS

The above-mentioned and other objects, features and advantages of this invention will become more apparent by reference to the following detailed description of the invention taken in conjunction with the accompanying drawings, wherein

FIGS. 5a to 5e are the diagrams for explaining the effect of the present invention by modeling the prior art semiconductor chip and the semiconductor chip according to the second embodiment of the present invention.

FIGS. 7a to 7m are sectional diagrams schematically showing manufacturing steps, in order, of a semiconductor chip of a fourth embodiment of the present invention; FIGS. 7a, 7h and 7j to 7l are sectional diagrams corresponding to a portion taken along line D—D' in FIG. 6e as viewed in the direction of arrows, and FIGS. 7b to 7g, 7i and 7m are sectional diagrams corresponding to a portion taken along line E—E' in FIG. 6e as viewed in the direction of arrows.

DETAILED DESCRIPTION OF THE PREFERRED EMBODIMENTS

Referring to FIGS. 1a to 1d, the method of fabrication and the structure of the semiconductor chip part in the semiconductor device according to the first embodiment of the present invention. The semiconductor device in the first embodiment has a two-level wiring structure with wires are made of gold (Au). The intermediate insulating film of the semiconductor device in the first embodiment is made of a silicon oxide film.

Figure 1A:
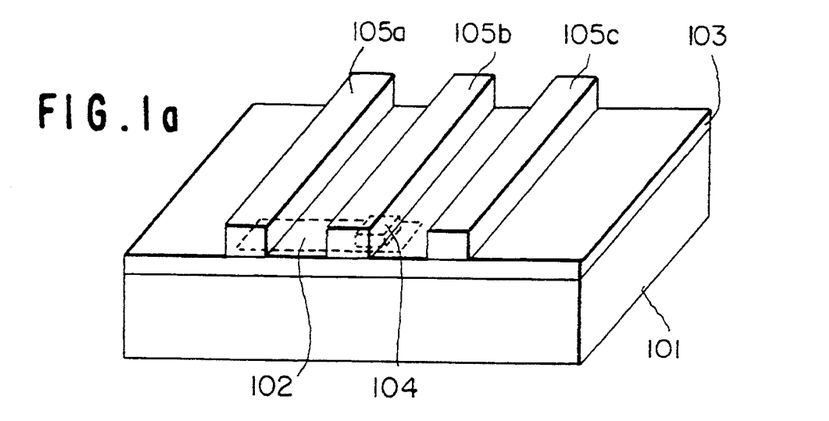
FIGS. 1a to 1d are perspective drawings schematically showing manufacturing steps in order of the semiconductor chip of a first embodiment of the present invention.

First, as shown in FIG. 1a, on a major surface of a silicon substrate 101 which is a semiconductor substrate having an impurity region 102 of a prescribed semiconductor circuit element at a predetermined position, there is formed a silicon nitride layer 103 which is an isolator layer. At a required place in the silicon nitride layer 103 there is formed a contact hole 104. Then, a group of first Au wiring 105a, 105b and 105c are formed. The film thickness, the line width and the space between the lines of the first Au wiring 105 are 1.0 $\mu$m, 1.0 $\mu$m and 1.0 $\mu$m, respectively. The etching for forming the first Au wiring employs A$\gamma$ ion milling at a vacuum of about $10^{-4}$ Torr.

It is to be noted that the semiconductor element and the contact hole will be omitted from the figures in order to avoid the complication of the drawings.

Figure 1B:
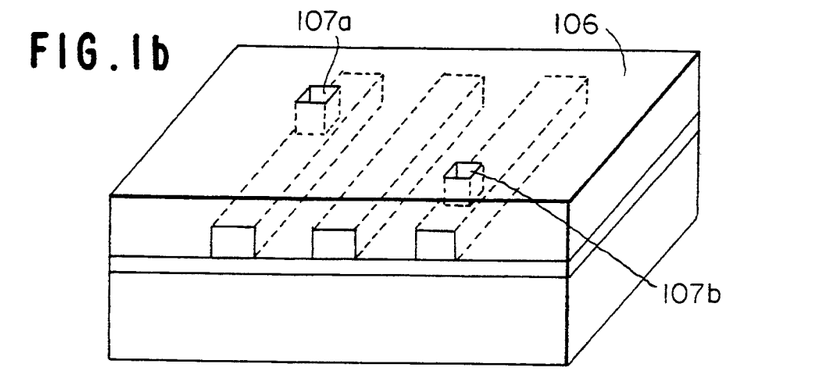

Next, a silicon oxide film 106 which is an intermediate insulating film is formed by, for example, a plasma chemical vapor deposition method as shown in FIG. 1b. The thickness of the silicon oxide film 106 is 2 $\mu$m. When the first level wiring are formed of Au as in the first embodiment and the intermediate insulating film is a silicon oxide film, the method of forming the silicon oxide film needs not be limited to the plasma chemical vapor deposition method and a chemical vapor deposition method at a low pressure or the atmospheric pressure may also be employed. However, when the first layer wiring are formed of aluminum (Al) and the intermediate insulating film is a silicon oxide film, the method of formation of the silicon oxide film is preferred to be the plasma chemical vapor deposition method. Subsequently, through holes 107a and 107b are formed at required places of the silicon oxide film 106. The opening area of the through hole is $0.8 \times 0.8$ $\mu m^2$.

Figure 1C:
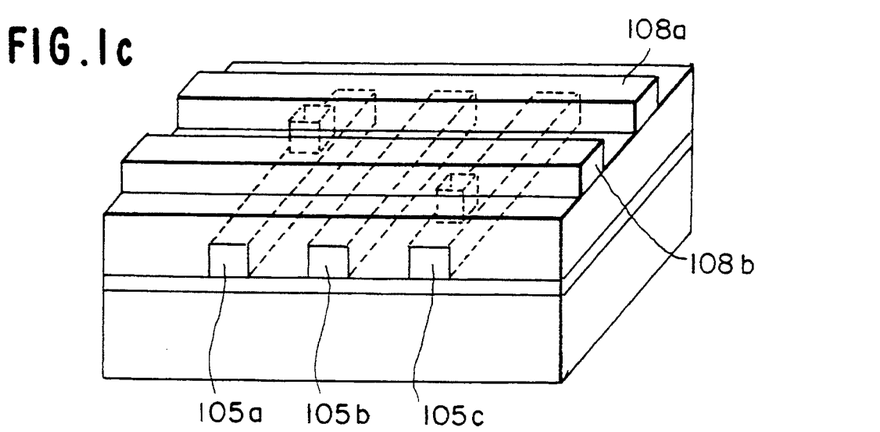

Next, as shown in FIG. 1c, a second group of Au wiring 108a and 108b are formed. The film thickness, width and space of the second Au wiring 108 are 1.0 $\mu m$, 1.0 $\mu m$ and 1.0 $\mu m$, respectively, same as those of the first Au wiring 105. In addition, the etching method for forming the second Au wiring 108 is the same as the method for forming the first Au wiring 105. The second Au wiring 108 fills the interior of the through holes 107a and 107b also. Accordingly, the second Au wiring 108a and 108b are connected to the first Au wiring 105a and 105c, respectively, via the through holes 107a and 107b.

Figure 1D:
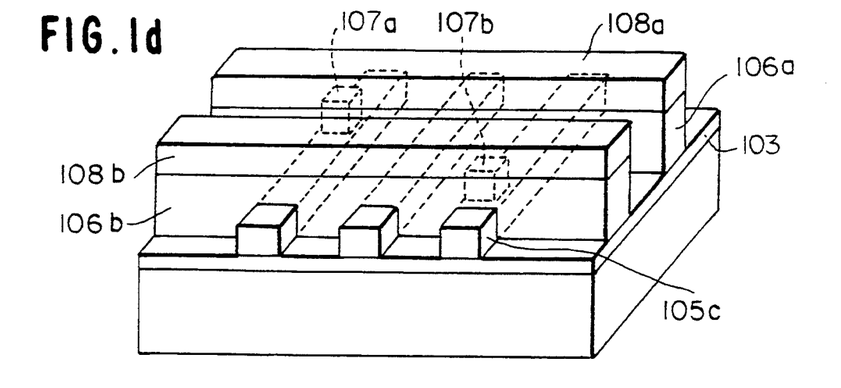

Next, as shown in FIG. 1d, the silicon oxide film 106 which is an intermediate insulating film is etched using the second Au wiring 108a and 108b as the mask. The etching of the silicon oxide film 106 is carried out by an anisotropic plasma etching (for example, reactive ion etching or electron cyclotron resonance plasma etching) which uses $CF_4$ or $CHF_3$ as the main constituent to which is added $O_2$.

In the semiconductor chip according to the first embodiment, the pattern of the silicon oxide films 106a and 106b which are the intermediate insulating films have the same pattern of the second Au wiring 108a and 108b, except for the portions of the through holes 107a and 107b, and the silicon oxide films 106a and 106b are formed in a wall-like shape extending from the bottom surfaces of the second Au wiring 108a and 108b to the top surface of the silicon nitride layer 103 of a insulator layer. Because of this, the silicon oxide film 106 does not exist between the second Au wiring 108a and 108b. Moreover, between the first Au wiring 105 and the second Au wiring 108, there exist the silicon oxide films 106a and 106b only at the portions where the first Au wiring 105 and the second Au wiring 108 overlap each other.

From the fact that the intermediate insulating film exists in the form as described in the above, the parasitic capacitance between the second-level wiring in the first embodiment is reduced compared with the case of a semiconductor chip of the conventional two-level wiring in which an intermediate insulating film exists filling the spaces between the wiring.

In the first embodiment described in the above, a silicon nitride layer is used as the insulating layer 103 and a silicon oxide film is used as the intermediate insulating film 106. However, a silicon oxide layer may be used as the insulating layer 103 and a silicon nitride film may be used as the intermediate insulating film 106. In this case, a plasma chemical vapor despotion is used as the method for forming the silicon nitride film. In addition, an anisotropic plasma etching that uses $CF_4$ or $CHF_3$ as the main constituent with added $H_2$ and $N_2$ is employed for etching the silicon nitride layer.

Moreover, although Au is used as the first and the second level wiring in the first embodiment, Al, polysilicon, a high-melting point metal such as tungsten (W), a silicide such as $SiW_2$ or a composite of polysilicon and silicide (polycide) may also be used for that purpose. Furthermore, different component materials may be used for the first and the second level wiring.

Still further, although a silicon substrate is used as the semiconductor substrate, it may be replaced by a compound semiconductor substrate.

Figure 2:
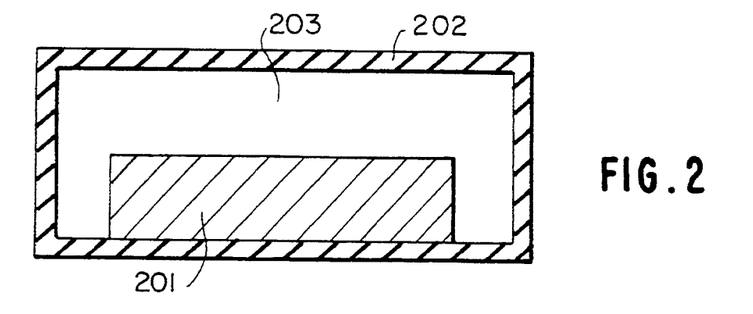
FIG. 2 is a sectional drawing schematically showing a semiconductor device including the semiconductor chip of the first embodiment of the present invention.

FIG. 2 is a rough sectional diagram of a semiconductor device that includes the semiconductor chip 201 shown as the first embodiment or following embodiments of the present invention. The semiconductor chip 201 is installed within a package 202. The package 202 has a cavity 203 which is filled with an inert gas such as $N_2$. Because of this, the voids between the wiring of the intermediate insulating films shown in the first embodiment become filled with a material of a low dielectric constant, that is, with the inert gas. As a result, even when the semiconductor chip is mounted on a package, the effect of the present invention will not be diminished. It is to be noted that the lead wires that are connected to the chip 201 and extend to the outside of the package 202 are omitted to show from FIG. 2.

Figure 3:
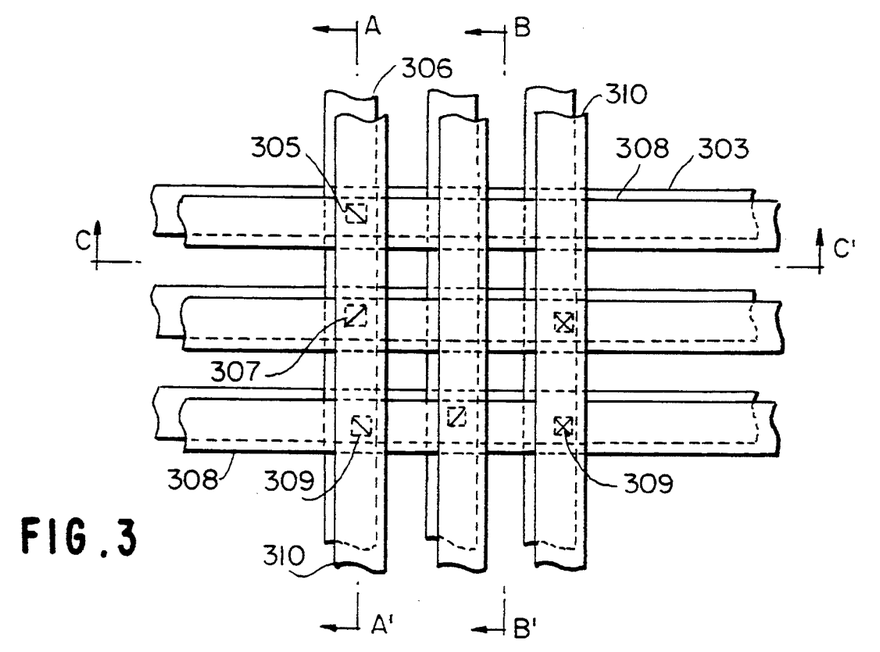
FIG. 3 is a partial plan view of a second embodiment of the present invention.
Figure 4A:
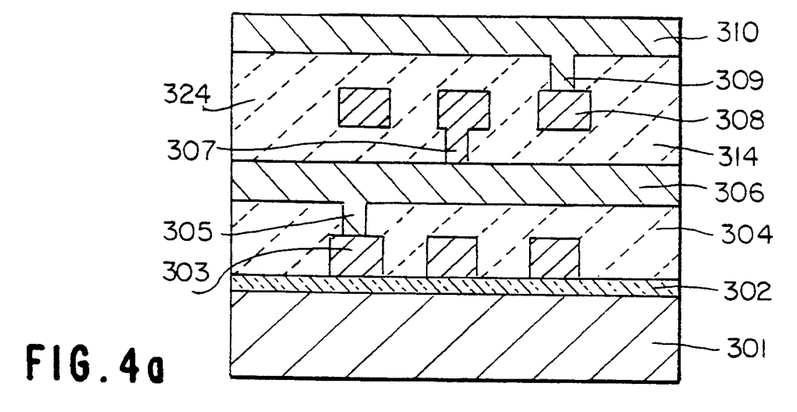
FIGS. 4a, 4b and 4c are sectional diagrams taken along lines A—A', B—B and C—C' in FIG. 3 as viewed in the direction of the arrows, respectively.
Figure 4B:
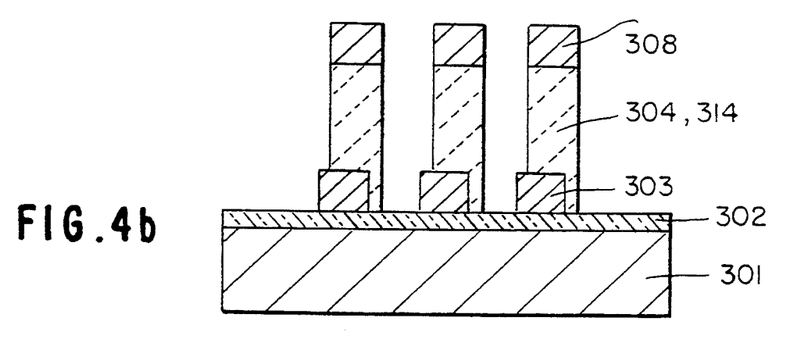
Figure 4C:
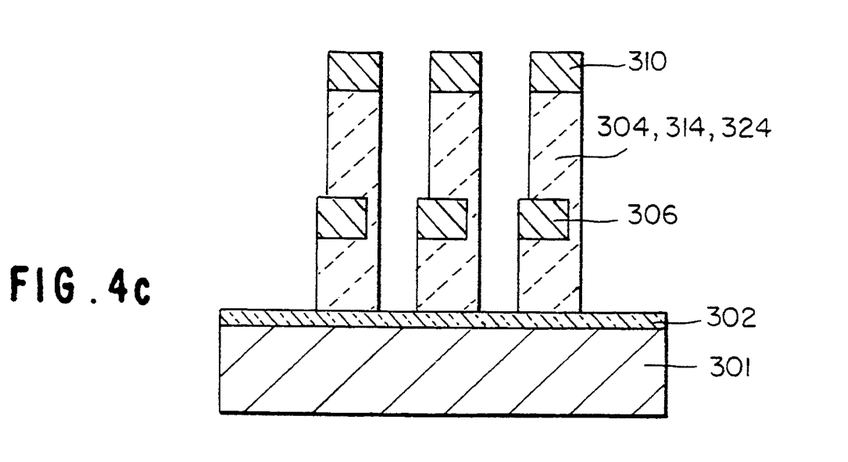

Referring to FIG. 3 and FIGS. 4a to 4c, the structure of the semiconductor chip part in the semiconductor device of the second embodiment of the present invention will be described. Here, FIGS. 4a, 4b and 4c are sectional diagrams of the semiconductor chip at the lines AA', BB' and CC' in the FIG. 3.

The semiconductor device in the second embodiment has a four-level wiring structure with wiring are made of Au. The intermediate insulating film of the semiconductor device are made of a polyimide siloxane film.

The structure of the second embodiment can be obtained using the method of fabrication described below.

First, a silicon oxide layer 302 which is an insulating layer is formed on a major surface of a silicon substrate 301 which is a semiconductor substrate having prescribed semiconductor elements at predetermined positions. A contact hole (not shown) is formed at a required place in the silicon oxide layer 302. Then, a first Au wiring 303 are formed. The thickness, width and space of the first Au wiring are 1.0 $\mu m$, 1.0 $\mu m$ and 1.0 $\mu m$, respectively. The etching for forming the first Au wiring 303 is carried out by the same method as in the first embodiment. Next, a polyimide siloxane film 304 which is an intermediate insulating film is formed by spin-on coating. The thickness of the polyimide siloxane film 304 is 2 $\mu m$. Subsequently, a first through hole is provided at a required place of the polyimide siloxane film 304. The opening area of the through hole 305 is $0.8 \times 0.8$ $\mu m^2$.

Next, a second Au wiring 306 are formed. The thickness, width and space of the second Au wiring 306 are 1.0 $\mu m$, 1.0 $\mu m$ and 1.0 $\mu m$, respectively. Next, a polyimide siloxane film 314 which is an intermediate insulating film, is spin-on coated again. The thickness of the polyimide siloxane 314 is also 2 $\mu m$. Subsequently, a second through hole 307 is formed at a required place of the polyimide siloxane film 314. The opening area of the through hole 307 is $0.8 \times 0.8$ $\mu m^2$.

Next, the third Au wiring 308 are formed. The thickness, width and space of the third Au wiring are 1.0 $\mu m$, 1.0 $\mu m$ and 1.0 $\mu m$, respectively. Then, a polyimide siloxane film 324 which is an intermediate insulating film is spin-on coated again. Here again, the thickness of the polyimide siloxane film 324 is 2 $\mu m$. Subsequently, a third through hole 309 with an opening area of $0.8 \times 0.8$ $\mu m^2$ is formed at a required place of the polyimide siloxane film 324.

Next, a fourth Au wiring 310 are formed. The thickness, width and space of the fourth Au wiring 310 are 1.0 μm, 1.0 μm and 1.0 μm, respectively.

Finally, polyimide siloxane films 304, 314 and 324 are etched using the fourth Au wiring 310, the third Au wiring 308 and the second Au wiring 306 as the masks. The etching of the polyimide siloxane films is an anisotropic plasma etching using $O_2$ (for example, reactive ion etching, electron cyclotron resonance plasma etching or the like).

A supplementary description will be given concerning the formation of the second Au wiring 306, the third Au wiring 308 and the fourth Au wiring 310. These wiring are formed by etchings, using patterns composed of photoresist films as the masks. Then, the photoresist films used as the masks are removed by an organic solvent. If the photoresist films are removed in this case by the ordinary plasma ashing or etching that uses $O_2$, the polyimide siloxane films 304, 314 and 324 which are intermediate insulating films will also be etched.

A further explanation concerning the etching of the polyimide siloxane films is also in order. The etching will first proceed with the fourth Au wiring 310 as the mask. During this stage, the portion of the pattern of the polyimide siloxane film 324 left after the etching is the same as the pattern of the fourth Au wiring 310. With the progress of the etching, the third Au wiring 308 will be exposed. At the stage when the third Au wiring 308 are exposed, the etching of the polyimide siloxane film 314 proceeds with the fourth Au wiring 310 and the third Au wiring 308 as the masks. During this stage, the pattern of the polyimide siloxane films 324 and 314 that remains after the etching is a superposition of the pattern of the fourth Au wiring 310 and the pattern of the third Au wiring 308. With a further progress in the etching, the second Au wiring 306 are exposed. At the stage when the second Au wiring are exposed, the etching of the polyimide siloxane film 304 proceeds with the fourth Au wiring 310, the third Au wiring 308 and the second Au wiring 306 as the masks until the silicon oxide film 302 is reached. The pattern of the polyimide siloxane films 324, 314 and 304 in the final stage is the same as the pattern which is the superposition of the pattern of the fourth Au wiring, the pattern of the third Au wiring 308 and the pattern of the second Au wiring 306.

For the portion corresponding to the cross-section along with the dash line AA' in FIG. 3, the patterns of the fourth Au wiring 310 and the second Au wiring 306 overlap in the entire region. Because of this, the cross-section of this portion is filled with the polyimide siloxane films 304, 314 and 324 as shown in FIG. 4a. For the portion corresponding to the cross-section along with the dashed line BB' in FIG. 3, there exists portions where the patterns of the third Au wiring 308 and the first Au wiring 303 partially overlap. Because of this, the cross-section along with the dashed line BB' is not completely filled with the polyimide siloxane films 304, 314 and 324, and voids or spaces are formed in the polyimide siloxane films 304 and 314, as shown in FIG. 4b. Similarly, in the cross-section corresponding to the dashed line CC' in FIG. 3, there exists portions where the patterns of the fourth Au wiring 310 and the second Au wiring 306 are partially overlapped. Because of this, the cross-section of the portion corresponding to the dashed line CC' is not filled completely with the polyimide siloxane films, and there voids are formed in the polyimide siloxane films 304, 314 and 324.

Although a polyimide siloxane film is used as the intermediate insulating film in the second embodiment, a polyimide film may be used instead. The etching for the case of using the polyimide film is the same as the etching in the case of using the polyimide siloxane film. Further, a silicon oxide film is used as the insulating layer. However, another inorganic insulating layer such as a silicon nitride film may also be used.

Moreover, although Au is used for wiring in the first, second, third and fourth levels, Al, a high-melting-point metal such as W, Si, a silicide such as $SiW_2$ or a polysilicide may also be used for that purpose. In addition, the constituent materials for the respective levels of wiring may be different.

Further, although a silicon substrate is used as the semiconductor substrate, a compound semiconductor substrate may be used.

Referring to FIGS. 5a to 5e, the conventional semiconductor chip and the semiconductor chip in accordance with the second embodiment of the present invention will be modeled, and the effect of the present invention will be described.

Figure 5A:
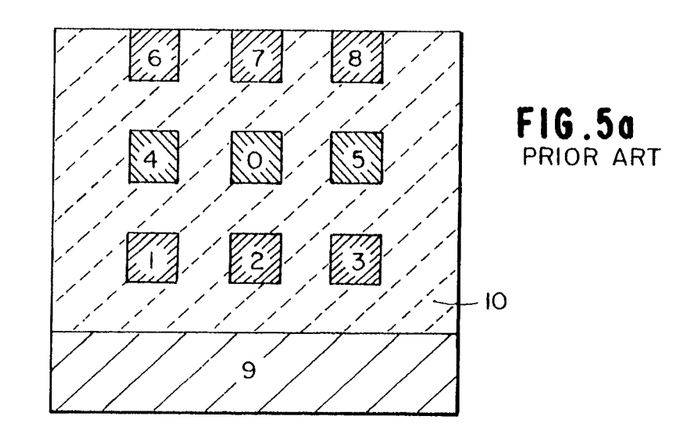
FIG. 5a is a sectional diagram schematically showing a semiconductor chip of the prior art.
Figure 5B:
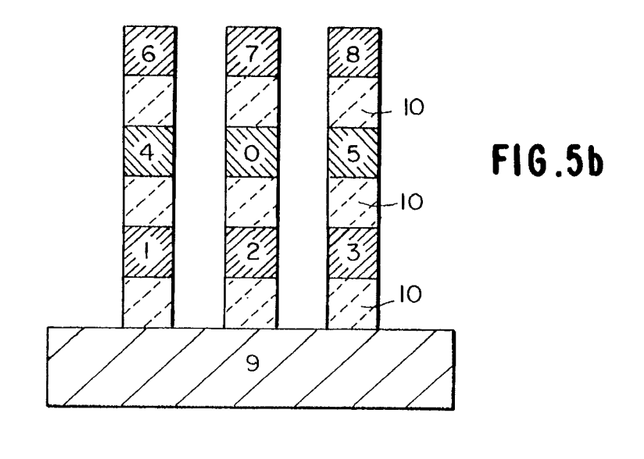
FIG. 5b is a sectional diagram schematically showing the second embodiment of the present invention.

As shown in FIGS. 5a and 5b, the structures of the two modeled chips are as described in the following. The first Au wiring 1, 2 and 3, the second Au wiring 4, 0 and 5 and the third Au wiring 6, 7 and 8 are formed on a silicon substrate 9. These wiring are arranged in parallel with each other. The pattersn of the third Au wiring 6, the second Au wiring 4 and the first Au wiring 1 are completely overlapped with each other. Similarly, the patterns of the third Au wiring 7, the second Au wiring 0 and the first Au wiring 2, and the patterns of the third Au wiring 8, the second Au wiring 5 and the first Au wiring 3 respectively, overlap completely. The thickness, width and space of the first Au wiring are 1.0 μm, 1.0 μm and 1.0 μm, respectively. Similarly, the thickness, width and space of the second Au wiring and of the third Au wiring are 1.0 μm, 1.0 μm and 1.0 μm, respectively. The space between the silicon substrate 9 and the first Au wiring, the space between the first Au wiring and the second Au wiring and the space between the second Au wiring and the third Au wiring are all 1.0 μm. In the conventional semiconductor chip, a polyimide siloxane film 10 is filled between the wiring and the silicon substrate. On the other hand, in the semiconductor chip according to the second embodiment of the present invention, the polyimide siloxane film 10 exists only between the silicon substrate 9 and the first Au wiring and in the portions where the wiring patterns overlap. Strictly speaking, an inorganic insulator layer such as silicon oxide, silicon nitride exists between the silicon substrate 9 and the first Au wiring, but the inorganic insulator layer is replaced by the polyimide siloxane film 10 as an aspect of the modeling. Moreover, the reason for omitting the fourth Au wiring is that their influence on the second Au wiring 4, 0 and 5 is negligible.

Using the structures shown in FIGS. 5a and 5b, the coupling capacitances is generated between the second Au wiring 0, and other wiring and the silicon substrate 9.

Figure 5C:
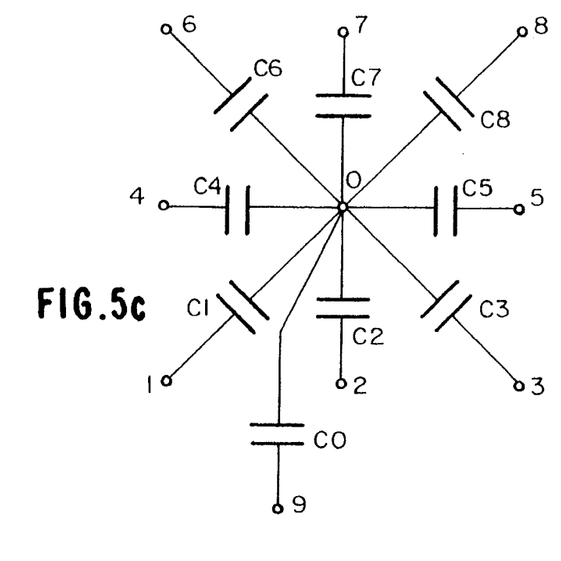
FIG. 5c is an equivalent circuit diagram corresponding to FIGS. 5a and 5b.

FIG. 5c is an equivalent circuit diagram showing the coupling capacitances generated between the second Au wiring 0, and the other wiring and the silicon substrate 9. The symbol $C_0$ represents the coupling capacitance per unit length between the second Au wiring 0 and the silicon substrate 9, and $C_i$ ($i=1, 2, \ldots, 8$) represents the coupling capacitance per unit length between the second Au wiring 0 and the wiring i. The sum of the coupling capacitances per unit length is given by $C_{total} = C_0 + \Sigma C_i$, but one has $C_{total} = C_2 + C_7 + C_4 + C_5$ since the contributions of $C_2$, $C_7$, $C_4$ and $C_5$ dominate the others.

Figure 5D:
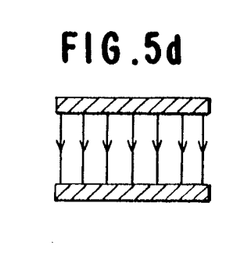
FIGS. 5d and 5e are diagrams showing the models used for calculation of capacitance.
Figure 5E:
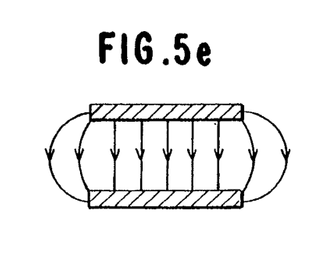

Now, the dielectric constant of the polyimide siloxane film 10 is given by $\epsilon_p^* = \epsilon_p/\epsilon_{air} = 3.2$, FIG. 5d is the parallel plate model and FIG. 5e is the fringe model of a capacitor, and $C_i$ according to the parallel plate model and the fringe model are denoted as $C_{i,p}$ and $C_{i,f}$, respectively. Further, $C_i$ for FIG. 5a and FIG. 5b will be denoted as $C_i^{(a)}$ and $C_i^{(b)}$, respectively.

In the case of the conventional semiconductor chip, it can be formed that $C_{2,p}^{(a)} = C_{7,p}^{(a)} = C_{4,p}^{(a)} = C_{5,p}^{(a)} = 2.83 \times 10^{-5}$ pF/$\mu$m for the parallel plate model, and $C_{2,f}^{(a)} \alpha C_{2,p}^{(a)}$ for the fringe model. From actual measurements and a simulation it is formed that $\alpha = 1.8$. From the results in the above, it follows that $C_{total}^{(a)} = 4\alpha\, C_{2,p}^{(a)} = 7.2\, C_{2,p}^{(a)}$.

On the other hand, in the case of the semiconductor chip according to the second embodiment of the present invention, it can be formed that $C_{4,f}^{(b)} = C_{5,f}^{(b)} \approx (\epsilon_p^*)^{-1}\alpha\, C_{2,p}^{(a)}$, $C_{2,f}^{(b)} = C_{7,f}^{(b)} = C_{2,p}^{(a)} + (\epsilon_p^*)(\alpha - 1)C_{2,p}^{(a)}$, so that there is obtained $C_{total}^{(b)} = 2[1 + (\epsilon_p^*)^{-1}(2\alpha - 1)] \times C_{2,p}^{(a)} = 3.6\, C_{2,p}^{(a)}$. As a result, according to the above model, the parasitic capacitance due to the coupling capacitance of the present invention can be made about 50% of that of the conventional model.

It should be noted that the structure shown in FIG. 5 shows the best effect of the present invention. However, the wiring pattern of the actual semiconductor chip resembles rather the situation shown in FIG. 3 where the wiring of the adjacent levels cross perpendicularly with each other. In this case, the parasitic capacitance is given by the arithmetic mean of $C_{total}^{(a)}$ and $C_{total}^{(b)}$ which is about 72% of the value for the conventional structure.

A compound semiconductor device is known as a semiconductor device in which no intermediate insulating films are inserted between the wiring and between the wiring and the semiconductor substrate. Such a wiring structure is known as an air gap metallization.

However, a compound semiconductor device of the above structure does not have a multi-level structure and its wiring length is in the order of several tens of micrometers. It is not a semiconductor device that is made to be of high density, and is a semiconductor device including single-level semiconductor devices. The reason it is infeasible for this structure to obtain a semiconductor device which is of high density and has multi-level wiring is that it is impossible to hold the positions of the wiring and the spatial configuration between the wiring. This wiring structure is weak not only against mechanical impact but also against heat. Its mechanical asepct will be self-evident so that it will not be touched upon. As to the thermal aspect, when the semiconductor device is operated, there will arise thermal expansion of wiring due to Joule's heat. Since the thermal expansion cannot be checked, there will occur changes particular by in the spaces between the wiring of different levels. In the extreme cases short-circuitings between the wiring may occur.

FIGS. 6a to 6f and FIGS. 7a to 7m are diagrams for explaining the semiconductor devices of the third embodiment and the fourth embodiment, respectively, of the present invention. It will be shown that it is possible to provide wiring structures that approximate the air gap metallization in compound semiconductor devices by the third and the fourth embodiments of the present invention.

FIGS. 6a to 6f are perspective views schematically showing the semiconductor chip in the semiconductor device according to the third embodiment of the present invention as arranged in the order of the fabrication steps. The semiconductor device according to the third embodiment has a two-level wiring structure with wiring consisting of Al.

Figure 6A:
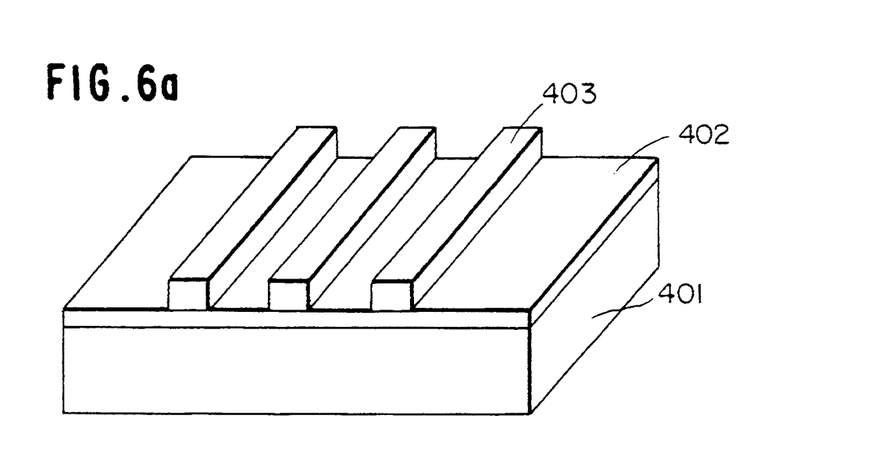
FIGS. 6a to 6f are perspective diagrams schematically showing manufacturing steps, in order, of a semiconductor chip of a third embodiment of the present invention.

First, as shown in FIG. 6a, a silicon oxide layer 402 which is an insulator film is formed on a major surface of a silicon substrate 401 which is a semiconductor substrate that has prescribed semiconductor elements (not shown) mounted on predetermined positions. A contact hole (not shown) is provided at a required position in the silicon oxide film 402. Then, an Al film which is a first conductive film and a first Al wiring 403 are formed. The thickness width and space of the first Al wiring 403 are 0.5 $\mu$m, 0.6 $\mu$m and 0.6 $\mu$m, respectively. The first Al wiring 403 are formed by etching the Al film by an anisotropic plasma etching that uses chlorine-based gas such as $BCl_3$ or $Cl_2$ (for example, reactive ion etching, electron cyclotron resonance plasma etching, or the like) with a pattern of photoresist film formed on the Al film as the mask. The photoresist film is removed by a plasma ashing using $O_2$.

Figure 6B:
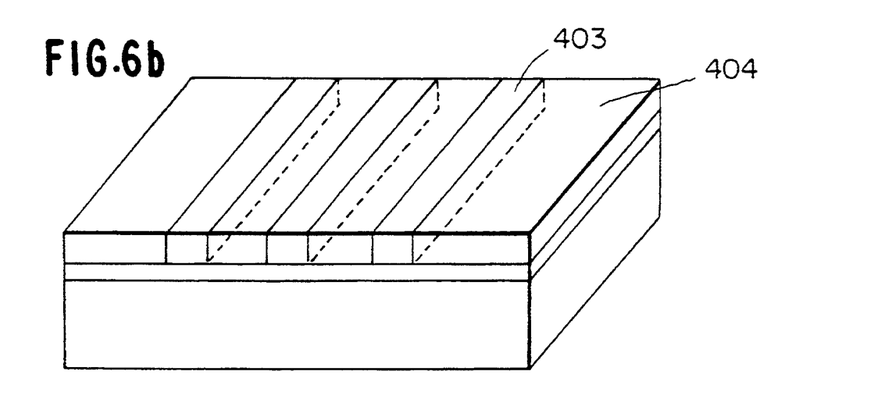

Next, as shown in FIG. 6b, first, a polyimide film 404 is formed by spin-on coating. The thickness of the polyimide film 404 at this stage is greater than that of the first Al wiring 403. Subsequently, the polyimide film 404 is etched back by a plasma etching using $O_2$. This plasma etching is continued until the top surfaces of the first Al wiring 403 are completely exposed. The etching back is stopped at the time when the top surfaces of the first Al wiring are exposed. Because of this, there exists a polyimide film 404 with thickness of 0.5 $\mu$m between the first Al wiring 403. Further, because of the above processing, the surface formed by the first Al wiring and the polyimide film 404 becomes flat.

Figure 6C:
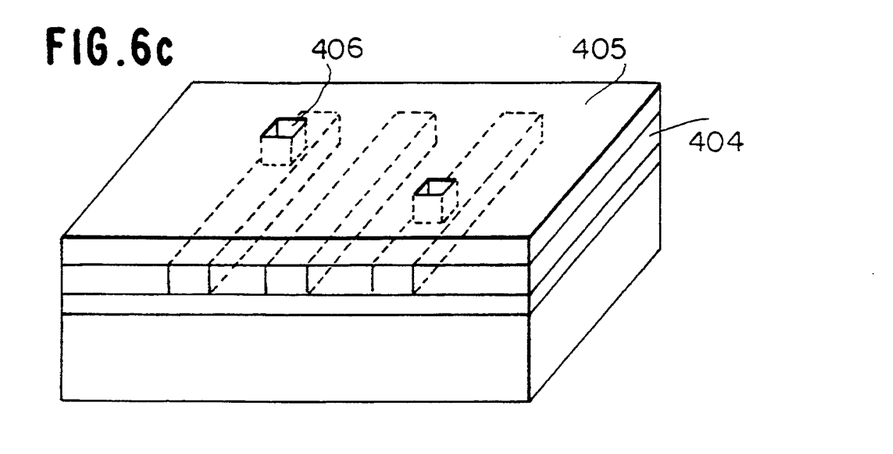

Next, as shown in FIG. 6c, first, a silicon oxide film 405 of thickness 0.3 $\mu$m which is a first intermediate insulating film is formed. The formation of the silicon oxide film 405 is carried out by a plasma chemical vapor deposition. Because of the formation of the silicon oxide film by this method, the polyimide film 404 which is the first organic insulator film can survive the above processing without being affected to a slightest extent. If, on the other hand, the silicon oxide film 404 is formed by some other method that accompanies a high temperature, the polyimide film 404 will be modified by the heat. Subsequently, a first through hole 406 is created at a required place on the silicon oxide film 405.

Figure 6D:
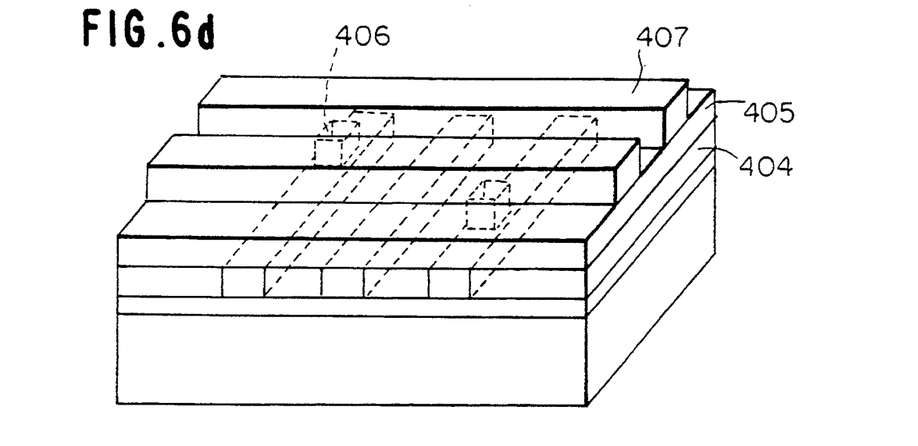

Next, an Al film which is a second conductive film is formed, for example, by magnetron sputtering. Then, a pattern of a photoresist film for second wiring is formed on the Al film which is the second conductive film. Using the pattern as the mask, the second Al wiring 407 are formed by adopting the same method as in the formation of the first Al wiring 403, as shown in FIG. 6d. The thickness, width and space of the second Al wiring are 0.5 $\mu$m, 0.8 $\mu$m and 0.8 $\mu$m, respectively. The shape of the chip at this stage is as shown in FIG. 6d. It is to be noted that the photoresist film pattern for the second wiring is still remaining there, but is omitted from the figure to simplifying the drawing.

Figure 6E:
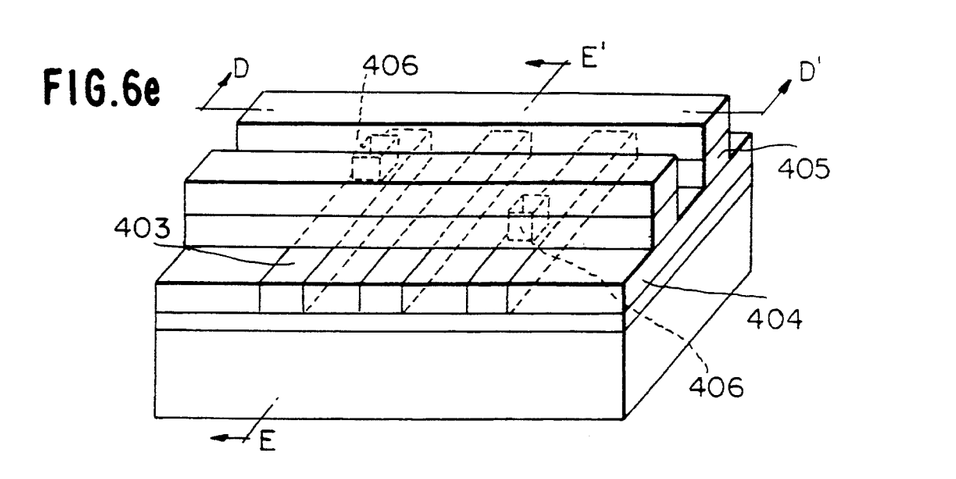

Next, the silicon oxide film 405 which is the first intermediate insulating film is etched by an anisotropic plasma etching using CF$_4$ or CHF$_3$ as the main constituent with added O$_2$ (for example, reactive ion etching, electron cyclotron resonance plasma etching or the like). The pattern of the silicon oxide film 405 is the same as the pattern of the second Al wiring 407 except for the portions of the through holes 406. The mask for the above etching is the combination of the photoresist film pattern for the second wiring and the second Al wiring 407. The reason for leaving the photoresist film pattern for the above-mentioned etching is to protect the second Al wiring 407 from the etching. Next, the photoresist film used as the mask is released by an organic solvent. The shape of the chip at this stage is as shown in FIG. 6e. Since this is a two-level wiring, the photoresist film may be removed by an ordinary plasma ashing using O$_2$.

Figure 6F:
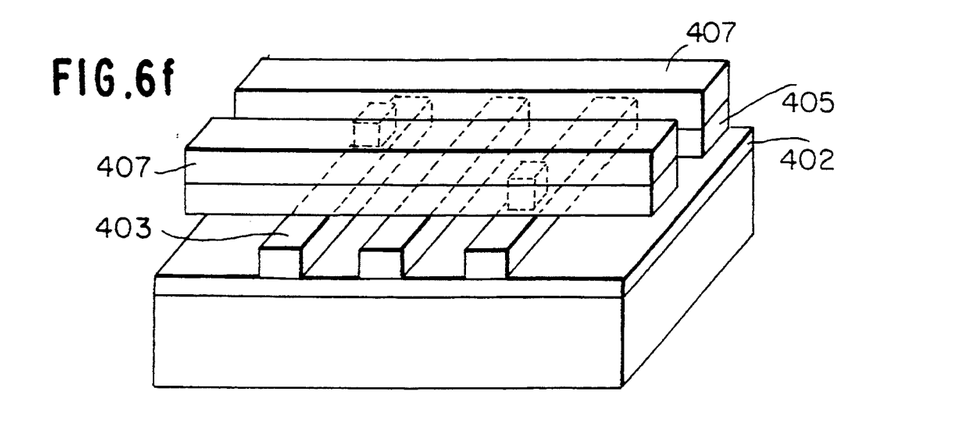

Next, as shown in FIG. 6f, the polyimide layer 404 which is the first organic insulator layer is removed by an isotropic plasma etching using O$_2$.

At this stage, a quasi air gap metallization for a two-level wiring structure is formed. At the portions where the second Al wiring 407 are not crossing the first Al wiring 403, there are formed cavities in the lower parts of the second Al wiring. Between a second Al wiring 407 and another second Al wiring 407 there does not exist the silicon oxide film 405 which is the first intermediate insulating film, and a cavity is formed. Only those portions where the second Al wiring 407 cross or overlap the first Al wiring 403 have the structure which are the same as those of the conventional case. When the parasitic capacitance for the structures of the third embodiment is estimated according to the technique as shown in the second embodiment of the present invention by using the above-mentioned structures and the dielectric constant $\epsilon_{SiO2}^* = 4.0$ of the silicon oxide film 405, it becomes about $\frac{1}{3}$ to $\frac{1}{2}$ of the parasitic capacitance of the conventional structures.

The effect of the third embodiment can be summarized as follows. At the crossing parts of the second Al wiring 407 and the first Al wiring 403 there exist the silicon oxide film 405 which is the first intermediate insulating film. Because of this, the present embodiment has a greater mechanical strength than the air gap metallization of a compound semiconductor device. Further, on the bottom surface of the second Al wiring 407, there is formed the first intermediate insulating film 405 in close contact with said bottom surface. Because of this, the deformation due to thermal expansion can be reduced in the third embodiment.

It should be noted that a polyimide film is used as the organic insulator film in the third embodiment, however, a polyimide siloxane film may be used instead. The method of removing the polyimide siloxane film is the same as the removal method for the case of using the polyimide film. Further, the silicon oxide film used as the insulator film may be replaced by other inorganic insulator film such as a silicon nitride film.

Moreover, a silicon oxide film formed by a plasma chemical vapor deposition is used as the intermediate insulating film. However, a silicon nitride film formed by the plasma chemical vapor deposition or a silicon oxynitride film formed by the plasma chemical vapor deposition may be used instead. In this case, the intrinsic effect of the present embodiment can be enhanced since the mechanical strength of these films is higher than that of the silicon oxide film obtained by the plasma chemical vapor deposition. However, since the dielectric constant of these films is higher than that of the silicon oxide film obtained by the plasma chemical vapor deposition, the effect of the present invention becomes weaker than the case of using the silicon oxide film obtained by the plasma chemical vapor deposition.

Further, Al is used as the wiring for the first and the second levels. However, Au, Si a high-melting-point metal such as Au, a silicide such as SiW$_2$, a polycide or the like may also be used instead. Moreover, the constituent materials for the first and the second levels may be different.

Still further, the silicon substrate used as the semiconductor may be replaced by a compound semiconductor substrate.

FIGS. 7a to 7m are sectional views schematically showing the semiconductor chip in the semiconductor device according to the fourth embodiment of the present invention as arranged in order of the fabrication steps. The semiconductor device according to the fourth embodiment has a three-level wiring structure with wiring made of Al. The fourth embodiment starts with the structure shown in FIG. 6e of the third embodiment. FIGS. 7a, 7h and 7j to 7l are sectional views at the dashed lines DD' in FIG. 6e, and FIGS. 7b to 7g, 7i and 7m are sectional views at the dashed lines EE' in FIG. 6e.

The object of the fourth embodiment is to show a fabrication method for realizing a wiring structure with still larger number of levels on the basis of the third embodiment.

Figure 7A:
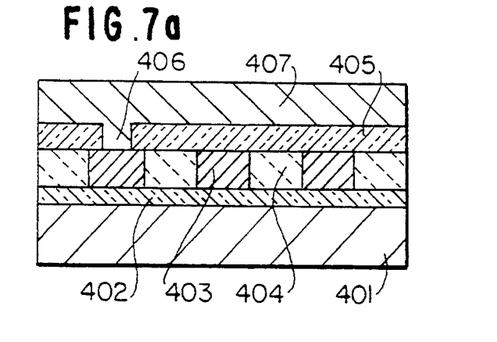
Figure 7B:
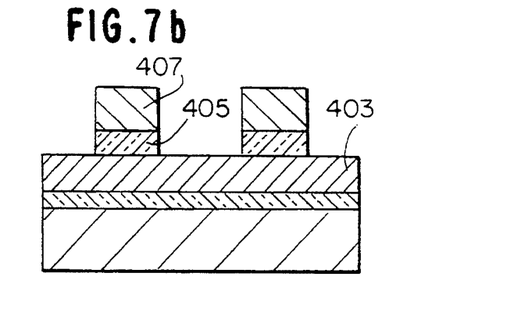

In FIGS. 7a and 7b, the pattern of a silicon oxide film 405 which is a second intermediate insulating film is the same as the pattern of a second Al wiring 405 except for the portion of a through hole 406. The bottom surface of the silicon oxide film 405 makes contact with a polyimide layer 404 which is a first organic insulator layer and the top surface of a first Al wiring 403. The polyimide layer 404 and the first Al wiring 403 are formed on a silicon substrate 401 which is a semiconductor substrate via the silicon oxide layer 402 which is an insulator film.

Figure 7C:
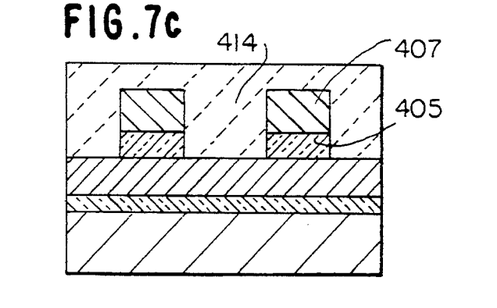

Next, as shown in FIG. 7c, a polyimide layer 404 which is a second organic insulator layer with a thickness of 1.0 μm is formed by spin-on coating. The top surfaces of the second Al wiring 407 are covered with the polyimide layer 414.

Figure 7D:
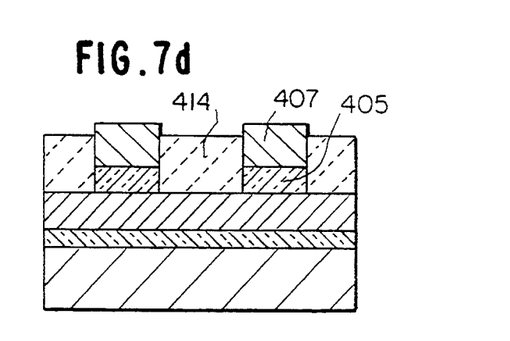

Next, as shown in FIG. 7d, the polyimide layer 414 is etched back to a thickness of 0.3 μm by a plasma etching using O$_2$. Because of this, a part of the side faces and the top surface of the second Al wiring 407 are exposed.

Figure 7E:
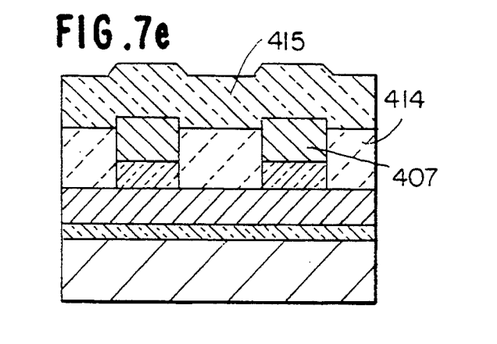

Next, as shown in FIG. 7e, a silicon oxide film 415 with thickness of 0.5 μm which is a second intermediate insulating film is formed by a plasma chemical vapor deposition.

Figure 7F:
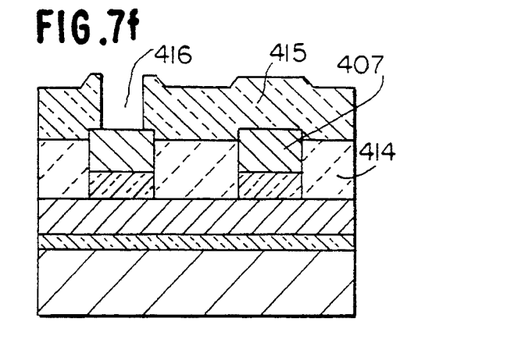

Next, as shown in FIG. 7f, a second through hole 416 is formed at a required place in the silicon oxide film 415.

Figure 7G:
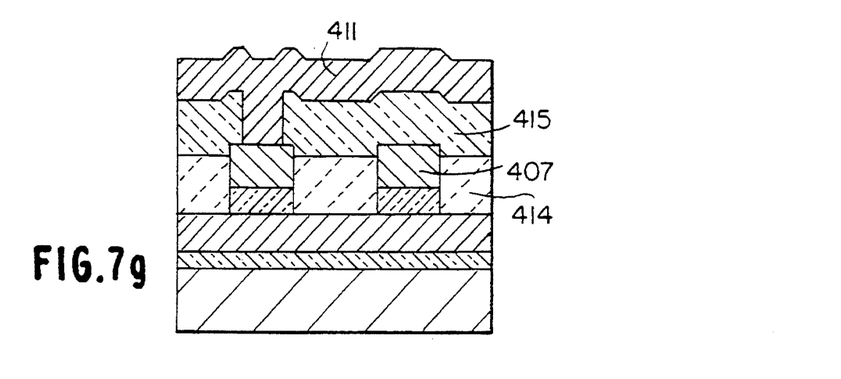

Next, as shown in FIG. 7g, an Al film 411 with a thickness of 0.5 μm which is a third conductive film is formed by, for example, a magnetron sputtering.

Figure 7H:
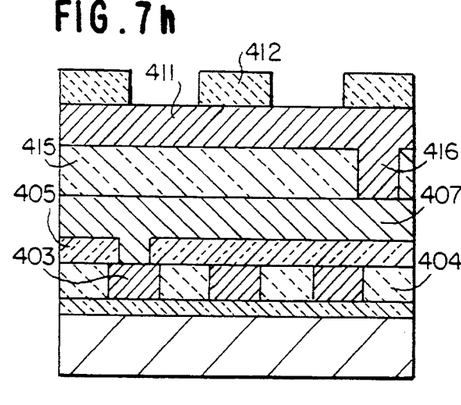
Figure 7I:
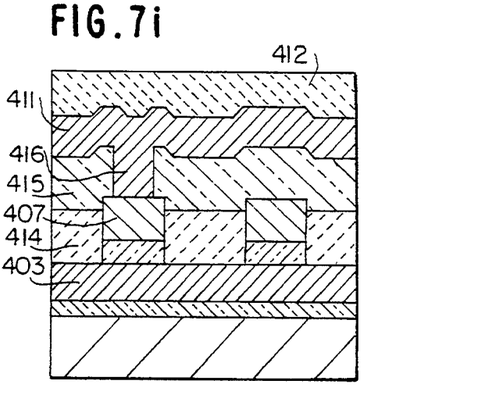

Next, as shown in FIGS. 7h and 7i, a photoresist film pattern for the third wiring is formed.

Figure 7J:
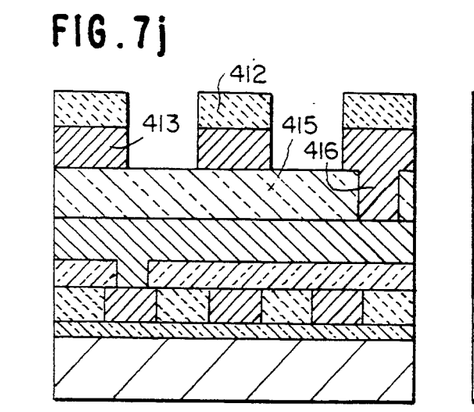

Next, as shown in FIG. 7j, the Al film 411 is etched by an anisotropic plasma etching using a chlorine-based gas such as BCl$_3$ and Cl$_2$ (for example, reactive ion etching, electron cyclotron resonance plasma etching or the like) with the pattern 412 as the mask. As a result, there is formed a third Al wiring 413. The width and the space of the third Al wiring are 1.0 μm and 1.0 μm, respectively.

Figure 7K:
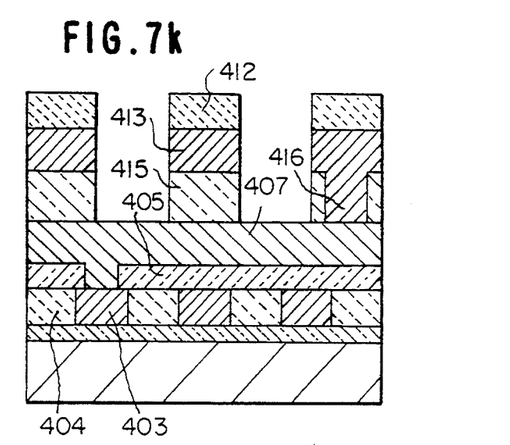

Next, as shown in FIG. 7k, the silicon oxide film 415 which is the second intermediate insulating film is etched by an anisotropic plasma etching (for example, the reactive ion etching, electron cyclotron resonance plasma etching or the like) using $CF_4$ or $CHF_3$ as the main constituent with added $O_2$ by using the pattern 412 and the Al wiring 413 as the masks. In this case, the side faces of the silicon oxide film 405 which is the first intermediate insulating film is covered with the polyimide film 414 which is the second organic insulator film (see FIG. 7c or FIG. 7d). Because of this, the silicon oxide film 405 will not be affected by the etching. At this stage, the pattern of the silicon oxide film 415 is the same as the pattern of the third Al wiring 413 except for the portion of the through hole 416.

Next, the photoresist film pattern 412 for the third wiring is removed using an organic solvent.

Figure 7L:
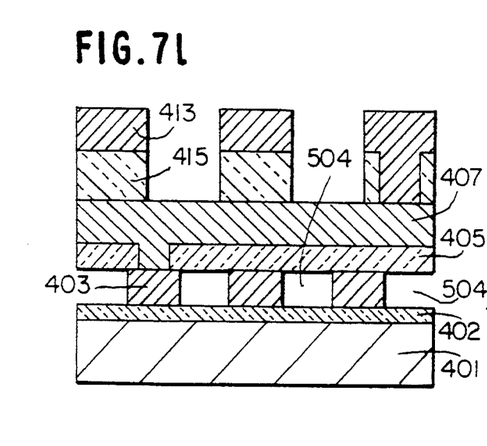
Figure 7M:
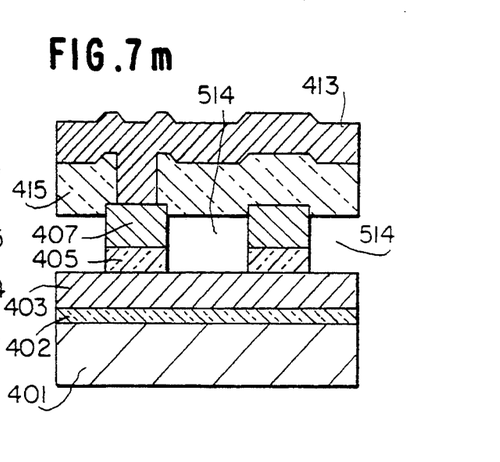

Finally, as shown in FIGS. 7l and 7m, the polyimide layer 414 which is the second organic insulator layer and the polyimide layer 404 which is the first organic insulator layer are removed by an isotropic plasma etching using $O_2$. As a result of the removal of the polyimide layers 404 and 414, there are formed cavities 504 and 514, respectively. With the processing in the above there is formed a quasi air gap metallization of a three-level wiring structure.

The effect of the invention by the fourth embodiment is equivalent to that of the third embodiment of the invention.

It should be noted that the polyimide layer used as the second organic insulator layer in the fourth embodiment may be replaced by a polyimide siloxane layer. The etching in the case where a polyimide siloxane layer is used is the same as the etching in the case where a polyimide film is used. In addition, although a silicon oxide film is used as the insulating film, other inorganic insulator such as a silicon nitride film may be used.

Moreover, a silicon oxide film by a plasma chemical vapor deposition is used as the intermediate film. However, a silicon nitride film obtained by a plasma chemical vapor deposition or a silicon oxynitride film obtained by a plasma chemical vapor deposition may be used instead. In this case, the effect intrinsic to the present embodiment will be enhanced. However, the effect of the invention will be lowered than in the case of using a silicon oxide film obtained by a plasma chemical vapor deposition.

Further, Al is used as the wiring for the first, the second and the third levels. However, it may be replaced by Cu, or use may be made of Si, a high-melting-point metal such as W, a silicide such as $SiW_2$ or a polysilicide may be used instead. In addition, the constituent materials for the first and the second levels may be different.

Still further, a silicon substrate used as the semiconductor substrate may be replaced by a compound semiconductor substrate.

Although the invention has been described with reference to specific embodiments, this description is not meant to be construed in a limiting sense. Various modifications of the disclosed embodiment, as well as other embodiments of the invention, will become apparent to persons skilled in the art upon reference to description of the invention. It is therefore contemplated that the appended claims will cover any modifications or embodiments that fall within the true scope of the invention.

What is claimed is:

1. A semiconductor device having a multilevel wiring structure, comprising a semiconductor substrate, an insulating layer covering said semiconductor substrate, first and second wiring at a lower level selectively formed on said insulating layer spaced apart from each other, an intermediate insulating film formed to cross each of said first and second wiring and covering only one part of each of said first and second wiring and keeping a remaining part of each of said first and second wiring exposed, said intermediate insulating film not covering a surface portion of said insulating layer between the remaining parts of said first and second wiring exposed, and a third wiring at an upper level formed on said intermediate insulating film along said intermediate insulating film to cross each of said first and second wiring.

2. The semiconductor device as claimed in claim 1, wherein a through hole is formed in said intermediate insulating film, a portion of said first wiring being in contact with a portion of said third wiring through said through hole.

3. The semiconductor device as claimed in claim 2, wherein said intermediate insulating film is a polyimide film.

4. The semiconductor device as claimed in claim 2, wherein said intermediate insulating film is a polyimide siloxane film.

5. The semiconductor device as claimed in claim 2, wherein said insulating layer and said intermediate insulating film are a silicon nitride film and a silicon oxide film, respectively.

6. The semiconductor device as claimed in claim 2, wherein said insulating layer and said intermediate insulating film are a silicon oxide layer and a silicon nitride film, respectively.

7. The semiconductor device as claimed in claim 1, wherein said intermediate insulating film is apart from a surface part of said insulating layer between said one parts of said first and second wiring to form a gap between therebetween.

8. The semiconductor device as claimed in claim 1, wherein said intermediate insulating film is in contact with a surface part of said insulating layer between said one parts of said first and second wiring with keeping the surface portion of insulating layer exposed.

* * * * *